United States Patent [19]
Tijburg et al.

[11] Patent Number: 5,756,403
[45] Date of Patent: May 26, 1998

[54] METHOD OF PREFERENTIALLY ETCHING A SEMICONDUCTOR SUBSTRATE WITH RESPECT TO EPITAXIAL LAYERS

[75] Inventors: Rudolf P. Tijburg, Eindoven, Netherlands; Sharon J. Flamholtz, Fishkill; Kevin W. Haberern, Hopewell Junction, both of N.Y.

[73] Assignee: Philips Electronics North America, New York, N.Y.

[21] Appl. No.: 581,233

[22] Filed: Dec. 29, 1995

[51] Int. Cl.$^6$ .................................................. H01L 21/302
[52] U.S. Cl. ........................... 438/745; 216/96; 216/108
[58] Field of Search ............................ 156/655.1, 656.1, 156/662.1; 216/108, 96; 252/79.1; 438/745

[56] References Cited

U.S. PATENT DOCUMENTS

| | | |
|---|---|---|
| 4,448,634 | 5/1984 | Lampert .................... 252/79.1 |
| 5,015,346 | 5/1991 | Guilinger et al. ............. 204/129.1 |
| 5,071,510 | 12/1991 | Findler et al. ............... 156/662.1 |
| 5,110,765 | 5/1992 | Bilakanti et al. ............. 437/225 |
| 5,279,704 | 1/1994 | Saito ....................... 252/79.1 |
| 5,419,808 | 5/1995 | Kitano ..................... 252/79.1 |
| 5,468,343 | 11/1995 | Kitano ..................... 156/662.1 |

FOREIGN PATENT DOCUMENTS

| | | |
|---|---|---|
| 426419A2 | 5/1991 | European Pat. Off. . |
| 0617458A2 | 9/1994 | European Pat. Off. . |
| 702414A2 | 3/1996 | European Pat. Off. . |

OTHER PUBLICATIONS

Vlasukova, L.A. "Exposure of boundaries in epitaxial Structures based on AIII BV" *Neorganicheskie materialy* 29(12) 1597–600, 1993. (abstract only)

Conway. K.L. et al "Etch rates for two material selective etches in the InGaASP/InP System" J. Appl. Phys. 53(3) 1836–1838, Mar. 1982.

Tijburg, R.P. et al "Selective Etching of III–V Compounds with Redox Systems" J. Electrochem. Soc. 687–691, May 1976 (vol. 123 No. 5).

*Primary Examiner*—R. Bruce Breneman
*Assistant Examiner*—Anita Alanko
*Attorney, Agent, or Firm*—Brian J. Wieghaus

[57] ABSTRACT

An etching composition and method for its use in etching a semiconductor structure, the semiconductor structure comprising a substrate and one or more epitaxial layers. The etching composition comprises a solvent, an etchant, and first and second complexing agents, the etchant and complexing agents being soluble in the solvent. The etchant preferentially etches the substrate with respect to at least one epitaxial layer. The first complexing agent is reactive with the substrate so as to accelerate the rate at which the etchant etches the substrate. The second completing agent is reactive with a component of the at least one epitaxial layer so as to form a resulting compound with the component. This reaction establishes an equilibrium between the resulting compound, the second complexing agent and the component, the equilibrium precluding significant etching of the at least one epitaxial layer. The etching composition preferably comprises an agent which provides for adjusting the acidity of the solution, and thereby provides for adjusting the etch rate of the substrate while maintaining the composition's etching characteristics with respect to the at least one epitaxial layer.

13 Claims, 1 Drawing Sheet

METHOD OF PREFERENTIALLY ETCHING A SEMICONDUCTOR SUBSTRATE WITH RESPECT TO EPITAXIAL LAYERS

BACKGROUND OF THE INVENTION

This invention relates to processing of semiconductor materials, particularly to a composition and method for preferentially etching a semiconductor substrate with respect to epitaxial layers, and products made using same.

In semiconductor and integrated circuit fabrication, processing generally includes forming epitaxial layers on a substrate. Moreover, processing often calls for removal of some, or substantially all, of the substrate relative to the epitaxial layers, while leaving the epitaxial layers substantially intact. In particular, removal of the substrate has been found desirable both at the substrate's interface with the epitaxial layers and from the back of the substrate opposite the epitaxial layers.

In the former case, removal of the substrate is directed at creating topographies useful in the manufacture of specific devices, such as vertical cavity surface emitting lasers. Removal can also be directed to increasing device density.

In the latter case, removal of the substrate is to accomplish various processing ends, including, as examples (i) eliminating of substances that can interfere with the performance of the semiconductor and integrated circuit devices, (ii) thinning the substrate prior to dividing it into individual devices, (iii) preparing the backside for subsequent processing, and (iv) quality control.

Quality control includes removal of the substrate to enable study of the epitaxial layers. This study generally is performed to identify the layers' physical properties, as well as their chemical and crystallographic purity. For example, this study typically includes evaluation, for one or more layers, of (i) the layer thickness, (ii) the concentration of desirable and undesirable impurities, (iii) the density and distribution of defects and (iv) any variation of these parameters over a selected surface area. This study typically is performed using electron microscopy, including transmission electron microscopy.

Ultimately, this study is performed toward advancing understanding the fabrication process and the operation of the semiconductor and integrated circuit devices to be produced. Such understanding typically leads to improvement in fabrication, device performance or both.

Techniques for removing substrate are known, each of which has associated problems. For example, it is known to mechanically remove selected portions of the substrate, which process is known as lapping. Lapping, however, tends to damage the crystalline structure of the remaining substrate. Moreover, lapping is undesirably inexact: it can leave behind substrate sought to be removed and it can remove substrate sought to be retained. In some applications, lapping results in one or more epitaxial layers being damaged or removed.

It is also known to remove substrate using chemical etching compositions and techniques. Generally, these etching compositions and techniques are preferential, being selected to etch the substrate while leaving the epitaxial layers undamaged. However, known preferential etching techniques can be undesirably slow or fast. When the etch rate is relatively slow, processing is impeded. When the etch rate is relatively fast, the etch can be difficult to control, leading to the removal of an incorrect amount of substrate.

Moreover, the etching composition is often somewhat reactive with one or more of the epitaxial layers, notwithstanding that the composition is selected to be relatively nonreactive with such layers. This reactivity tends to result in not insignificant etching of one or more epitaxial layers. For example, if a relatively large amount of the substrate is to be removed, the overall etch time can be relatively long. A longer etch time for the substrate, in turn, means a longer time for the etching composition to react with epitaxial layers. Over a sufficiently long time, the etching composition tends to etch one or more of the layers in an amount that is not insignificant.

Accordingly, a need exists for an improved etching composition and method for preferentially etching a semiconductor substrate with respect to one or more epitaxial layers. Moreover, a need exists for an improved etching composition and method for preferentially etching a gallium arsenide semiconductor substrate, with respect to one or more epitaxial layers, including with respect to layers comprising II-VI materials.

SUMMARY OF THE INVENTION

An object of the invention is to provide an improved etching composition and method for removing some, or substantially all, of a substrate with respect to one or more epitaxial layers, while leaving the epitaxial layers substantially unetched.

A further object of the invention is to provide an improved preferential etching composition and method for etching a gallium arsenide substrate with respect to one or more epitaxial layers, including layers comprising II-VI materials.

A specific object of the invention is to provide a preferential etching composition and method that etches a gallium arsenide substrate at a selectable rate, the etching composition etching an epitaxial layer in an amount that is not significant.

According to one aspect of the invention, an etching composition is provided for use in etching a semiconductor structure, the semiconductor structure comprising a substrate and one or more epitaxial layers. The composition comprises a solvent, an etchant and first and second complexing agents. The etchant preferentially etches the substrate with respect to at least one epitaxial layer. The first complexing agent is reactive with the substrate so as to accelerate the rate at which the etchant etches the substrate. The second complexing agent is reactive with a component of at least the one epitaxial layer so as to form a resulting compound with the component. The reaction between the second complexing agent and the component, however, is such that the resulting compound, the second complexing agent and the component exist in equilibrium in the solution. In this way, the second complexing agent provides that the at least one epitaxial layer is etched in an amount that is not significant and that is substantially independent of the etching duration.

In another aspect of the invention, a method is provided for etching a semiconductor structure, the semiconductor structure comprising a substrate and one or more epitaxial layers. The method comprises the steps of selecting a solvent, an etchant, and first and second complexing agents; mixing these elements to form a solution; immersing a portion of the semiconductor structure in the solution, whereby the substrate of that portion is preferentially etched with respect to the portion's epitaxial layers.

In this second aspect, the etching composition preferably is substantially similar to that described above, including employment of an acidity adjustment agent.

The various features of novelty which characterize the invention are pointed out with particularity in the claims annexed to and forming a part of this specification. For a better understanding of the invention, its operating advantages and specific objects attained by its use, reference should be made to the accompanying drawings and descriptive matter in which its preferred embodiments are illustrated and described, wherein like reference numerals identify the same or similar elements.

DETAILED DESCRIPTION OF THE PREFERRED EMBODIMENTS

Figure 1:
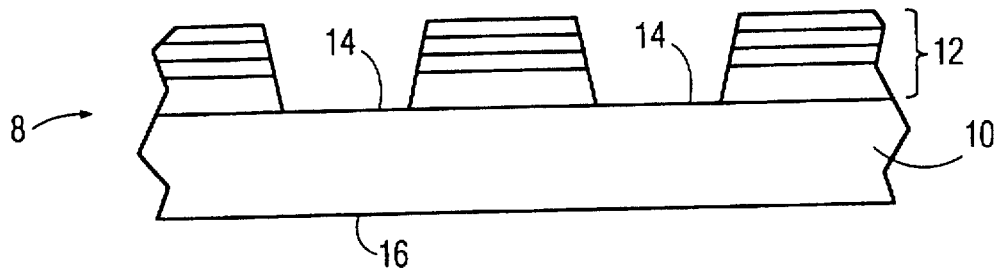
FIG. 1 is partial, schematic view, in cross-section and not to scale, of an exemplary semiconductor structure.

As shown in FIG. 1, an exemplary semiconductor structure 8 comprises a substrate 10 and a plurality of epitaxial layers 12. The substrate 10, in processing, can be exposed either at the interface 14 formed between the epitaxial layers 12 and the substrate 10 or at the back 16 of the substrate 10 opposite the epitaxial layers 12. Processing often calls for removal of some, or substantially all, of the substrate 10 relative to the epitaxial layers 12, while leaving these layers substantially intact. In particular, processing may require removal of the substrate 10 at the interface 14 or at the back 16, or both.

This invention contemplates an etching composition and method for use in etching the semiconductor structure 8 and, in particular, for preferentially etching the substrate 10 with respect to one or more of the epitaxial layers 12. The etching composition described hereinafter is generally applicable to substrates 10 comprising gallium arsenide [GaAs] and epitaxial layers 12 formed of II–VI materials, including, for example, zinc sulfide [ZnS], zinc selenium sulfide [ZnSeS], zinc magnesium selenium sulfide [ZnMgSeS] and zinc cadmium sulfide [ZnCdS]. However, it is to be recognized that the substrate can be formed of materials other than GaAs and the epitaxial layers may be formed by other than the above materials, without departing from the principles of the invention.

The etching composition according to the present invention comprises a solvent, an etchant and first and second complexing agents. The etchant has a redox potential intermediate between the redox potential of the substrate and the redox potential of at least one of the epitaxial layers. Thence, the etchant is capable of preferentially etching the substrate with respect to the at least one epitaxial layer. The etchant preferably is soluble in the solvent.

The first complexing agent is reactive with the substrate so as to accelerate the rate at which the etchant etches the substrate. For example, where the substrate is gallium arsenide, the complexing agent preferably is selected to take up gallium ions [$Ga^{3+}$]. The first complexing agent preferably is soluble in the solvent.

The second complexing agent is reactive with a component of the at least one epitaxial layer so as to form a resulting compound with the component. More specifically, the second complexing agent reacts with the component such that the resulting compound, the second complexing agent and the component exist in equilibrium in the solvent. In this manner, the etching composition is precluded from significantly etching the at least one epitaxial layer because the component can dissolve in the solvent in only acceptably minute amounts before equilibrium is established.

In particular, to minimize the etch of the at least one epitaxial layer, the second completing agent preferably is selected so that the resulting compound is highly insoluble in the solvent. To illustrate, where the at least one epitaxial layer comprises zinc and the solvent comprises water, the second completing agent preferably is selected to take up zinc ions [$Zn^{2+}$] removed by the etchant, so as to form a compound or compounds that are highly insoluble in water so as to reach saturation in the solvent and limit further etching of the layer by establishing the above-described equilibrium.

Therefore, the second complexing agent provides that the etching composition etches the at least one epitaxial layer in an amount that is not significant. Moreover, the second completing agent provides that the amount of etching of that layer is substantially independent of the etching duration.

It is to be recognized that the first and second completing agents can be the same or different, without departing from the principles of the invention.

The etching composition preferably comprises an acidity adjustment agent. The acidity adjustment agent provides for adjusting the acidity of the solution, and thereby provides for adjusting the etch rate of the substrate while maintaining the etching characteristics of the etching composition with respect to the at least one epitaxial layer. The acidity adjustment agent also preferably advances dissolution of the first and second complexing agents in the solvent.

In one specific embodiment, it has been determined that acceptable etch results are achieved in etching a semiconductor structure having a gallium arsenide substrate and a zinc selenium sulfide epitaxial layer, the following etching composition being employed: the solvent comprises approximately 50 ml of water, the etchant comprises approximately 7.5 gm of potassium ferric cyanide [$K_3Fe(CN)_6$ at 0.5 Mol/l], and the first and second complexing agents comprise approximately 1.25 gm of oxalic acid [$(COOH)_2$ at 0.2 Mol/l].

That is, particularly in the case of semiconductor structures comprising gallium and epitaxial layers comprising zinc, oxalic acid is a preferred complexing agent. Indeed, it is believed that oxalic acid can be used for the first and second complexing agents because it takes up not only gallium ions [$Ga^{3+}$], but also zinc ions [$Zn^{2+}$]. In the former action, gallium oxalate is formed, this compound being substantially soluble in water so that additional gallium ions can be etched by the etchant. In the latter action, zinc oxalate is formed, this compound being highly insoluble in water so that the above-described equilibrium is established without significant etching of the epitaxial layer.

It is believed that other oxalate-providing complexing agents may also be used, including zinc oxalate, gallium oxalate and ammonium oxalate, each without departing from the principles of the invention. It is to be recognized, however, that use of these other oxalate-providing complexing agents generally may implicate additional changes in the etching composition.

In this embodiment, the results were obtained using an acidity adjustment agent comprising ammonium hydroxide [$NH_4OH$] in an amount calculated to adjust the pH to a selected level. This acidity adjustment agent was also found to bring undissolved oxalic acid into solution.

For example, it has been determined that, at room temperature (approximately 25° C.), by adding ammonium hydroxide [$NH_4OH$] to establish the pH within a range of approximately 7.0 to 8.0, the etching composition yields a relatively optimized etch rate, e.g., 0.45 μm per minute, for a substrate comprising gallium arsenide [GaAs], while maintaining at substantially zero the etch rate for an epitaxial layer comprising zinc selenium sulfide [ZnSeS]. By comparison, in the absence of the first complexing agent, the etch rate of a gallium arsenide substrate has been found to be approximately only a few microns per hour.

The following describes the chemistry of this example. In an aqueous solution, the potassium ferric cyanide [$K_3Fe(CN)_6$] etchant dissociates, as follows:

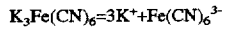

$$K_3Fe(CN)_6 = 3K^+ + Fe(CN)_6^{3-}$$

The $Fe(CN)_6^{3-}$ so formed, reacts with gallium arsenide [GaAs] as follows:

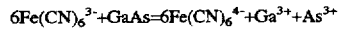

$$6Fe(CN)_6^{3-} + GaAs = 6Fe(CN)_6^{4-} + Ga^{3+} + As^{3+}$$

However, $Ga^{3+}$ is almost insoluble as $Ga(OH)_3$. The addition of oxalic acid [$(COOH)_2$] forms gallium oxalate which has a solubility of approximately 0.15 mol/l at pH=8. Moreover, when ammonium hydroxide [$NH_4OH$] is added to the solution, gallium ammonium oxalate is formed, which has a solubility of approximately 0.27 mol/l at pH=8.

The following table summarizes experimental results obtained when etching a semiconductor structure comprising a gallium arsenide [GaAs] substrate and a zinc selenium sulfide [ZnSeS] epitaxial layer. The results reflect stagnant etching at room temperature (approximately 25° C.) using the etching composition of the above-described first embodiment, together with an acidity adjustment agent comprising ammonium hydroxide [$NH_4OH$] added in an amount calculated to adjust the pH to selected levels.

| pH  | $V_{etch}$-ZnSeS (Å/min) | $V_{etch}$-GaAS (μm/min) |
|-----|--------------------------|--------------------------|
| 4.1 | 0                        | 0.25                     |
| 5.1 | 0                        | 0.36                     |
| 6.1 | 0                        | 0.25                     |
| 7.2 | 0                        | 0.45                     |
| 8.0 | 0                        | 0.45                     |
| 8.5 | 5                        | 0.45                     |
| 9.0 | 40                       | 0.45                     |

Etching performed in other then stagnant application accelerates the etch rate of gallium arsenide substrate, without changing the etch rate of the zinc-compound epitaxial layer. In particular, it has been determined that stirring can increase the etch rate of gallium arsenide substrate approximately three-fold. Other mechanical operations, such as agitation, are thought to have similar results.

In a second specific embodiment, it has been determined that acceptable etch results are achieved in etching a semiconductor structure having a gallium arsenide substrate and a zinc selenium sulfide epitaxial layer, the following etching composition being employed: the solvent comprises approximately 50 ml of water, the etchant comprises approximately 7.5 gm of potassium ferric cyanide [$K_3Fe(CN)_6$], and the first and second complexing agents comprise approximately 1.5 gm of tartaric acid [$C_4H_6O_6$].

That is, particularly in the case of semiconductor structures comprising gallium and epitaxial layers comprising zinc, tartaric acid is a preferred complexing agent. Indeed, it is believed that tartaric acid can be used for the first and second complexing agents because it takes up not only gallium ions [$Ga^{3+}$], but also zinc ions [$Zn^{2+}$]. In the former action, gallium tartarate is formed, this compound being substantially soluble in water so that additional gallium ions can be etched by the etchant. In the latter action, zinc tartarate is formed, this compound being highly insoluble in water so that the above-described equilibrium is established without significant etching of the epitaxial layer.

It is believed that other tartarate-providing complexing agents may also be used, including zinc tartarate, gallium tartarate and ammonium tartarate, each without departing from the principles of the invention. It is to be recognized, however, that use of these other tartarate-providing complexing agents generally may implicate additional changes in the etching composition.

In this second embodiment, the results were obtained using an acidity adjustment agent comprising ammonium hydroxide [$NH_4OH$] in an amount calculated to adjust the pH to a selected level. This aspect of the etching composition is described above and, therefore, is not repeated here.

It has been determined that, using the two embodiments, a temperature increase from room temperature to approximately 50° C. increases the etch rate as to a gallium arsenide [GaAs] substrate while not appreciable affecting the etch rate of a zinc selenium sulfide [ZnSeS] epitaxial layer. Using the first embodiment of the etching composition, it has been determined that elevating the temperature to approximately 50° C. results in an etch rate of approximately 1 μm/min for the substrate, while maintaining the etch rate of the zinc selenium sulfide [ZnSeS] at approximately 0Å/min. Moreover, using the second embodiment of the etching composition, it has been determined that the etch rate of such an epitaxial layer remains acceptably low even where this etch is performed at a temperature of approximately 65° C. It is to be recognized, however, that the temperature at which the etch occurs generally will have some optimum range, the range being factors dependent. The factors can include, for example and without limitation, the type of substrate, the desired etch rate of the substrate, the type of epitaxial layer or layers, and the level of acceptable epitaxial layer damage.

Figure 2:
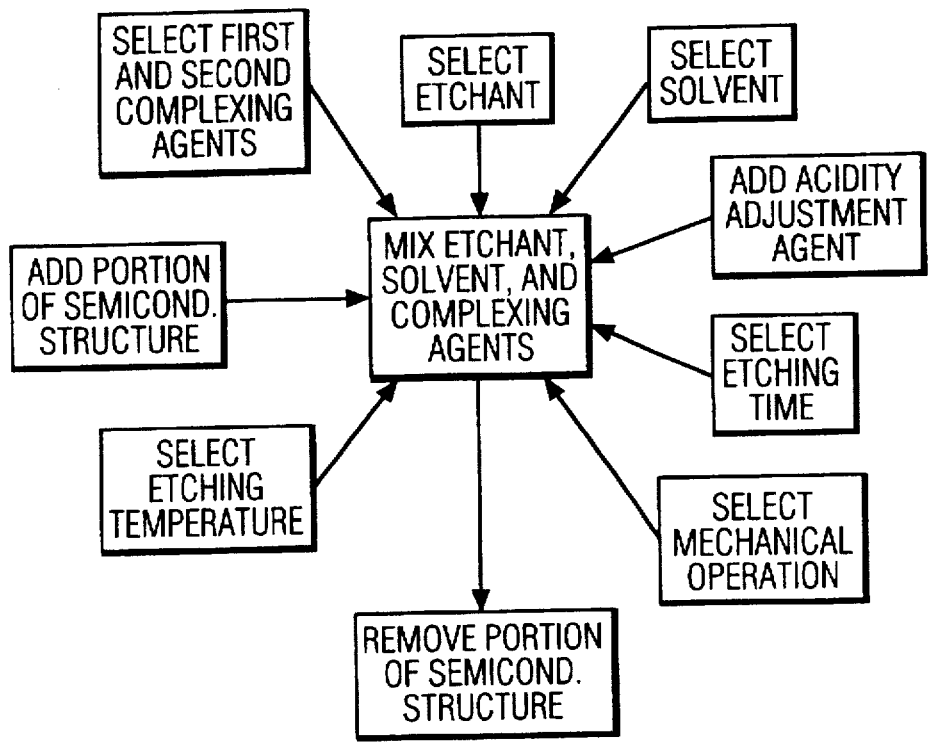
FIG. 2 is a flow chart of a method for etching a semiconductor structure having a substrate and one or more epitaxial layers, in accordance with the invention.

Turning to FIG. 2, a flow chart is shown of a method for etching a semiconductor structure having a substrate and one or more epitaxial layers is, the etching composition and method being in accordance with the invention. The method comprises the steps of selecting a solvent, an etchant, and first and second complexing agents; mixing these elements to form a solution; immersing a portion of the semiconductor structure in the solution, whereby the substrate of that portion is preferentially etched with respect to the portion's epitaxial layers.

In this method, the etching composition preferably is substantially similar to that described above, including employment of an acidity adjustment agent. The acidity adjustment agent preferably is added after mixing the solvent, the etchant and the first and second complexing agents, and before immersion of the substrate. In this manner, the mixed components are brought fully into solution and the acidity of the solution is established prior to immersion. One advantage of this order is that the etch of the substrate is subject to greater control.

Moreover, the method preferably comprises the step of selecting whether or not to operate mechanically on at least one of the solution or the semiconductor structure while the portion of the semiconductor structure is immersed. As described above, this step, performed for example by stirring or agitating the etching composition, generally accelerates the etch rate of the substrate.

The method also preferably comprises the step of selecting the temperature at which etching occurs. As described above, temperature generally affects the etch rate of the substrate while not causing any appreciable increase in the etch rate of the epitaxial layers.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A method for etching a semiconductor structure, the semiconductor structure comprising a substrate and one or more epitaxial layers, the method comprising:

selecting a solvent;

selecting an etchant that is soluble in the solvent, and that has a redox potential intermediate between the redox potential of the substrate and the redox potential of at least one of the epitaxial layers so as to preferentially etch the substrate with respect to the at least one epitaxial layer;

selecting a first complexing agent that is soluble in the solvent, and that is reactive with the substrate so as to accelerate the rate at which the etchant etches the substrate;

selecting a second complexing agent that is soluble in the solvent, and that is reactive with a component of the at least one epitaxial layer so as to form a resulting compound with the component, the reaction being such that the resulting compound, the second complexing agent and the component exist in equilibrium in solution, so that the at least one epitaxial layer is etched in an amount that is not significant and that is substantially independent of the etching duration;

mixing the solvent, the etchant and the first and second complexing agents so as to form a solution; and immersing the portion of the semiconductor structure to be etched in the solution, whereby the substrate is preferentially etched.

2. The method of claim 1, further comprising the step of removing the portion of the semiconductor structure from the solution after a time so as to achieve a selected etch of the substrate thereof.

3. The method of claim 1, further comprising the step of operating mechanically on at least one of the solution or the semiconductor structure while the semiconductor structure is immersed.

4. The method of claim 3, wherein the mechanical operation comprises at least one of agitation or stirring.

5. The method of claim 1 further comprising selecting the temperature at which etching occurs.

6. The method of claim 1, further comprising adding an acidity adjustment agent to the solution so as to adjust the acidity of the solution, and thereby so as to adjust the etch rate of the substrate while maintaining the etching characteristics respecting the at least one epitaxial layer.

7. The method of claim 6, wherein the step of adding of an acidity adjustment agent comprises selecting an acidity adjustment agent comprising ammonium hydroxide [NH$_4$OH], and the step of the selecting a solvent comprises selecting water, and wherein the acidity adjustment agent is added in an amount calculated to adjust the pH to approximately 8.0 or less.

8. The method of claim 6, wherein the step of adding an acidity adjustment agent is performed after the mixing step and before the immersion step and comprises selecting an acidity adjustment agent that brings into solution undissolved first and second complexing agents.

9. The method of claim 6, wherein the solvent is selected so as to comprise approximately 50 ml of water, the etchant is selected so as to comprise approximately 7.5 gm of potassium ferric cyanide [K$_3$Fe(CN)$_6$], the first and second complexing agents are selected to comprise approximately 1.25 gm of oxalic acid, and the step of adding an acidity adjustment agent comprises selecting an acidity adjustment agent comprising ammonium hydroxide [NH$_4$OH] which is added in an amount calculated to adjust the pH to approximately 8.0 or less.

10. The method of claim 6, wherein the solvent is selected so as to comprise approximately 50 ml of water, the etchant is selected so as to comprise approximately 7.5 gm of potassium ferric cyanide [K$_3$Fe(CN)$_6$], the first and second complexing agents are selected to comprise approximately 1.5 gm of tartaric acid, and the step of adding an acidity adjustment agent comprises selecting an acidity adjustment agent comprising ammonium hydroxide [NH$_4$OH] which is added in an amount calculated to adjust the pH to approximately 8.0 or less.

11. The method of claim 1, wherein the steps of selecting first and second complexing agents comprise selecting the same chemical compound.

12. The method of claim 1, wherein the steps of selecting first and second complexing agents comprise selecting at least one of an oxalate compound or a tartarate compound.

13. The method of claim 1, wherein the step of selecting an etchant comprises selecting potassium ferric cyanide [K$_3$Fe(CN)$_6$].

* * * * *